United States Patent [19]
Hadar et al.

[11] Patent Number: 5,871,141
[45] Date of Patent: Feb. 16, 1999

[54] FINE PITCH BONDING TOOL FOR CONSTRAINED BONDING

[75] Inventors: Ilan Hadar, Haifa; Avishai Shklar, Kfar Vitkin, both of Israel

[73] Assignee: Kulicke and Soffa, Investments, Inc., Wilmington, Del.

[21] Appl. No.: 861,965

[22] Filed: May 22, 1997

[51] Int. Cl.$^6$ .......................... H01L 21/60; H01L 21/603
[52] U.S. Cl. .......................... 228/180.5; 228/4.5
[58] Field of Search ................ 228/180.5, 110.1, 228/1.1, 4.5, 51, 55; 438/617

[56] References Cited

U.S. PATENT DOCUMENTS

| | | | |
|---|---|---|---|
| 4,571,688 | 2/1986 | Kashihara et al. | 228/1.1 |
| 4,974,767 | 12/1990 | Alfaro et al. | 228/4.5 |
| 5,558,270 | 9/1996 | Nachon et al. | 228/180.5 |
| 5,559,054 | 9/1996 | Adamjee | 228/197.1 |

*Primary Examiner*—Samuel M. Heinrich
*Attorney, Agent, or Firm*—John B. Sowell

[57] ABSTRACT

A fine pitch capillary bonding tool for making ball bonds having a consistent bonded ball size even though the air balls may vary in diameter is provided. The convential shaped bonding tool is provided with a novel ball constraining recess in the working tip. When an air ball is bonded it is forced into the constraining recess which has a shoulder portion for exerting a downward bonding force. The ball being bonded extrudes vertically into the constraining recess without laterial extrusion which would create mashed balls of varying diameter.

18 Claims, 8 Drawing Sheets

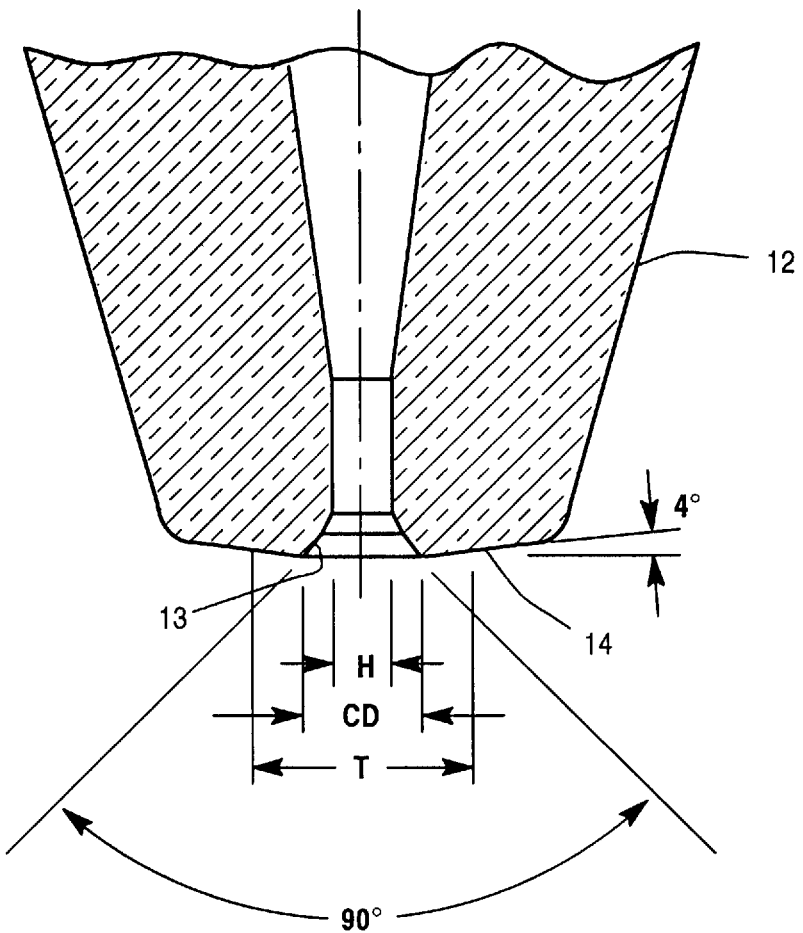
Figure 3
*PriorArt*

FINE PITCH BONDING TOOL FOR CONSTRAINED BONDING

BACKGROUND OF THE INVENTION

1. Field of the Invention

The present invention relates to bonding tools used for fine wire bonding. More particularly, the present invention relates to capillary bonding tools used for making conventional strength ball bonds while constraining and controlling the size of the finished ball bond.

2. Description of the Prior Art

Capillary wire bonding tools are well known in the prior art and are classified in International Class HOI 21/603 and in U.S. Class 228, Subclasses 1.4; 4.5; 180 and other subclasses.

Capillary wire bonding tools that are used in automatic ball thermosonic wire bonders have been standardized into families or groups designed for special applications or problems. Fine pitch bonding tools are especially designed to enable bonding of pads which are closely spaced one to another. Due to miniaturization of semiconductor chips such as computer chips, the lead out pads on the chip and the pitch or spacing of pads on chips are constantly growing smaller. Pad sizes of 3.0 mils square placed on 3.2 mil centers are now being bonded using 1.0 mil fine gold wire which is melted or flamed off to form a 1.6 to 1.7 mil diameter air ball which is mashed to form a first bond. The diameter after making the bond increases at least 10% so that the resulting bonded ball has an average diameter of 1.8 to 1.9 mils. The mashed ball bond is not symmetrical and the maximum diameter can easily exceed the size of the bonding pad. Since the bonding tool has some placement error offset from the center of the bonding pad, conventional ball bonding produces bonds which over flow the edges of a bonding pad and the bonded devices are rendered unacceptable.

In the prior art, the term constrained bond and constrained bonding generally referred to controlling the amount of mash-out or lateral extrusion of a ball during ball bonding. Heretofore, this broad terminology has also included reducing the diameter of the air ball so that the mashed and expanded ball is of lesser size than a conventional mashed ball. While it was known that the ball size ratio (BSR) could be reduced from about 2.4 times wire size to about 1.7, the bonded area and the shear strength of the bond was also diminished. Further, if the air ball was too small it would clog the hole in the capillary during a bonding operation.

U.S. Pat. No. 5,558,270, assigned to the same assignee as the present invention, shows and describes a bonding tool developed for producing unsymmetrical mashed balls and is incorporated by reference herein. This tool employs a non-symmetrical working face having an elongated chamfer recess defined by two chamfer diameters CD1 and CD2 and is designed for use in a rotary head wedge wire bonder. The elongated chamfer recess produces a mashed ball bond that is more narrow in width than in length, thus, is well suited for bonding state of art semiconductor chips.

It would be desirable to provide a fine pitch bonding tool that could produce a smaller symmetrical bonded ball having enhanced shear strength. Such a symmetrical tool would be used on conventional non-rotary head automatic gold wire bonding machines which operate at higher speeds than rotary head bonding machines but could also be used on rotary head bonding machines.

SUMMARY OF INVENTION

It is a primary object of the present invention to provide a capillary bonding tool for making consistently uniform size ball bonds from air balls that may vary in size.

It is a primary object of the present invention to provide a bonding tool for making fine pitch ball bonds having a smaller bonded area than prior art ball bonds.

It is a primary object of the present invention to provide a method and bonding tool for making smaller yet stronger bonded balls from fine wire of the same diameter than was possible heretofore.

It is a primary object of the present invention to provide a bonding tool for making smaller bonded area ball bonds than prior art ball bonds yet have a higher unit area shear strength.

It is another object of the present invention to provide a novel bonding tool that has a novel ball constraining recess formed into the working tip that may be employed on automatic wire bonding machines.

It is another object of the present invention to provide a novel bonding tool capable of controlling the diameter of the bonded balls made at first bond.

According to these and other objects of the present invention, standard and fine pitch capillary bonding tools are provided with a novel constraining recess which comprises a ball guiding portion, a ball constraining and shaping portion and a bonding force shoulder portion. The ball constraining recess is preferably stepped or tapered to cause a ball being bonded to be vertically extruded into and shaped by the constraining recess so that the surface of an air ball being bonded has controlled lateral extrusion.

BRIEF DESCRIPTION OF THE DRAWINGS

FIG. 3 is an enlarged elevation in section of another prior art double chamfer working tip of the type used on standard capillary bonding tools;

DETAILED DESCRIPTION OF THE PREFERRED EMBODIMENTS

Figure 1:
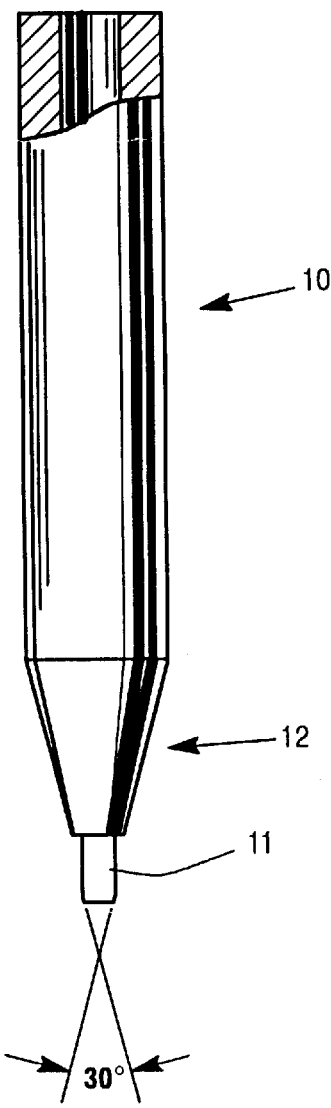
FIG. 1 is a side elevation view of a prior art bottleneck fine pitch bonding tool.

Refer now to FIG. 1 showing a well known prior art bottleneck fine pitch bonding capillary 10. The neck 11 of the tip 12 is provided with a tip angle of ten to fifteen degrees whereas the tip is usually about thirty degrees similar to standard tools. The reduced width of the neck 11 permits ball bonds to be made on close pitch pads without the neck 11 touching an adjacent loop of a bonded wire as explained in U.S. Pat. No. 5,558,270.

Figure 2:
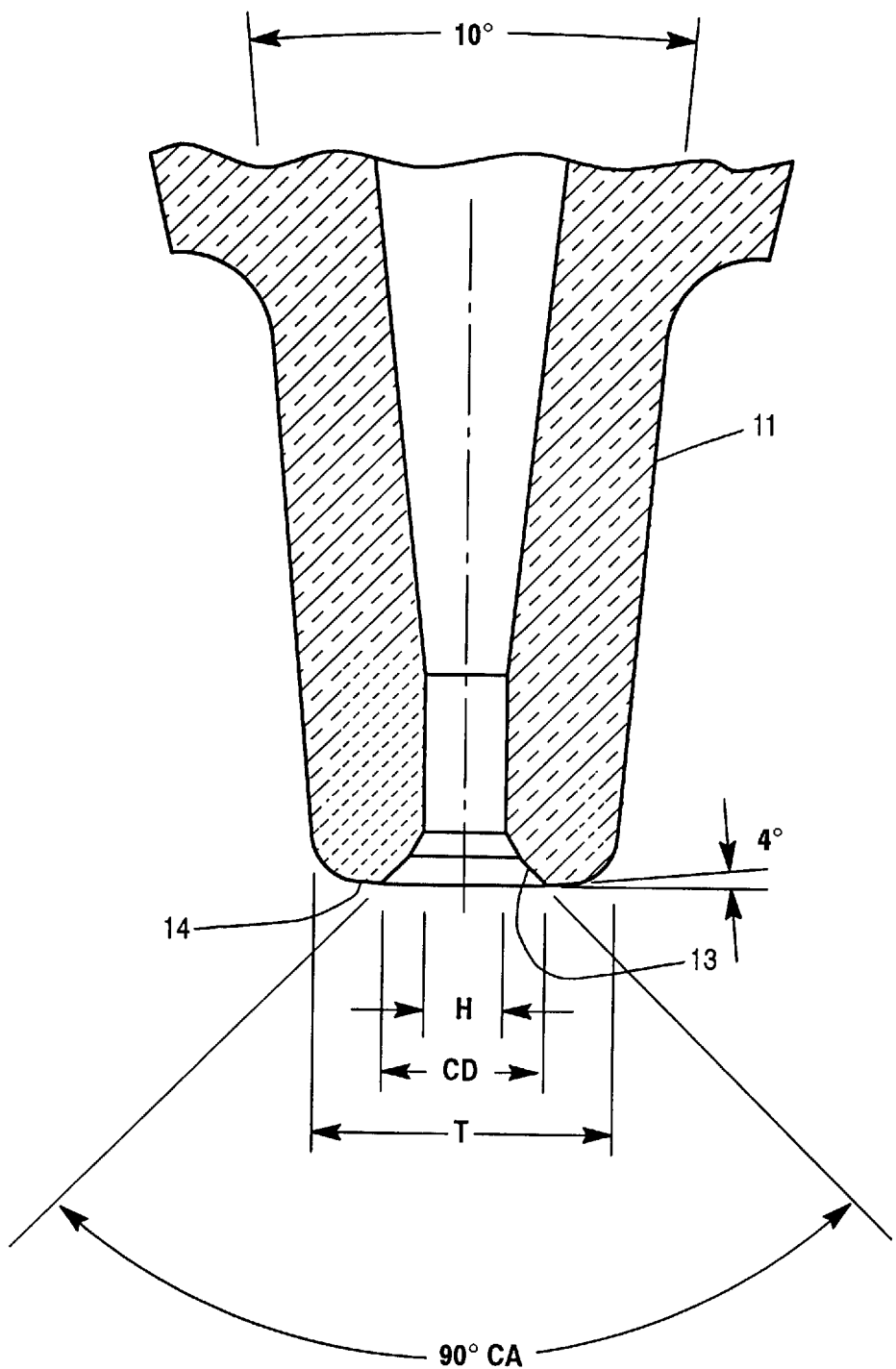
FIG. 2 is an enlarged elevation in section of a prior art double chamfer working tip of a bonding tool of the type used on bottleneck bonding tools.

Refer now to FIG. 2 showing an enlarged elevation in section of the neck 11 and working face 14 of a state of the art bottleneck fine pitch bonding tool of the type presently used to bond miniature pads on semiconductors having a pitch spacing of as small as 3.2 mils. In this state of the art fine pitch bonding tool the inner chamfer 13 has chamfer angle CA which is preferably 90 degrees and connects or continues with an inner chamfer angle ICA of lesser degrees designed to guide a fine wire into a wire hole of diameter H.

It is desirable to control the air ball size to about 2.0 mils for making bonded balls of 2.1 mils on 3 mil pads spaced on a 3.2 mil pitch. To achieve this very fine pitch result it is necessary to maintain an extremely accurate ball size smaller than the chamfer diameter CD. If an oversize ball is mashed by the outer chamfer 13, lateral extrusion occurs and the mashed ball may extend over the side of the pad creating an unacceptable bond. If the air ball is too small, excess downward movement of hte tool occurs and the tip edge of the bonding tool could engage the adjacent ball bond because the tip edges of the tool have a tip diameter T which extends to the edges of adjacent pads during a bonding operation.

Refer now to FIG. 3 showing an enlarged section in elevation of a prior art double chamfer bonding tool whose neck and tip extend at thirty degrees all the way to working face 14. While the neck of this tool is larger and thicker than the bottle neck 11 shown in FIG. 2, the size of the working face 14 and recesses therein may be the same size as the fine pitch tool shown in FIG. 2. As will be explained hereinafter, the present invention is equally applicable to the tools shown in FIGS. 2 and 3 for controlling bonded ball size and enhancing unit shear strength.

Figure 4:
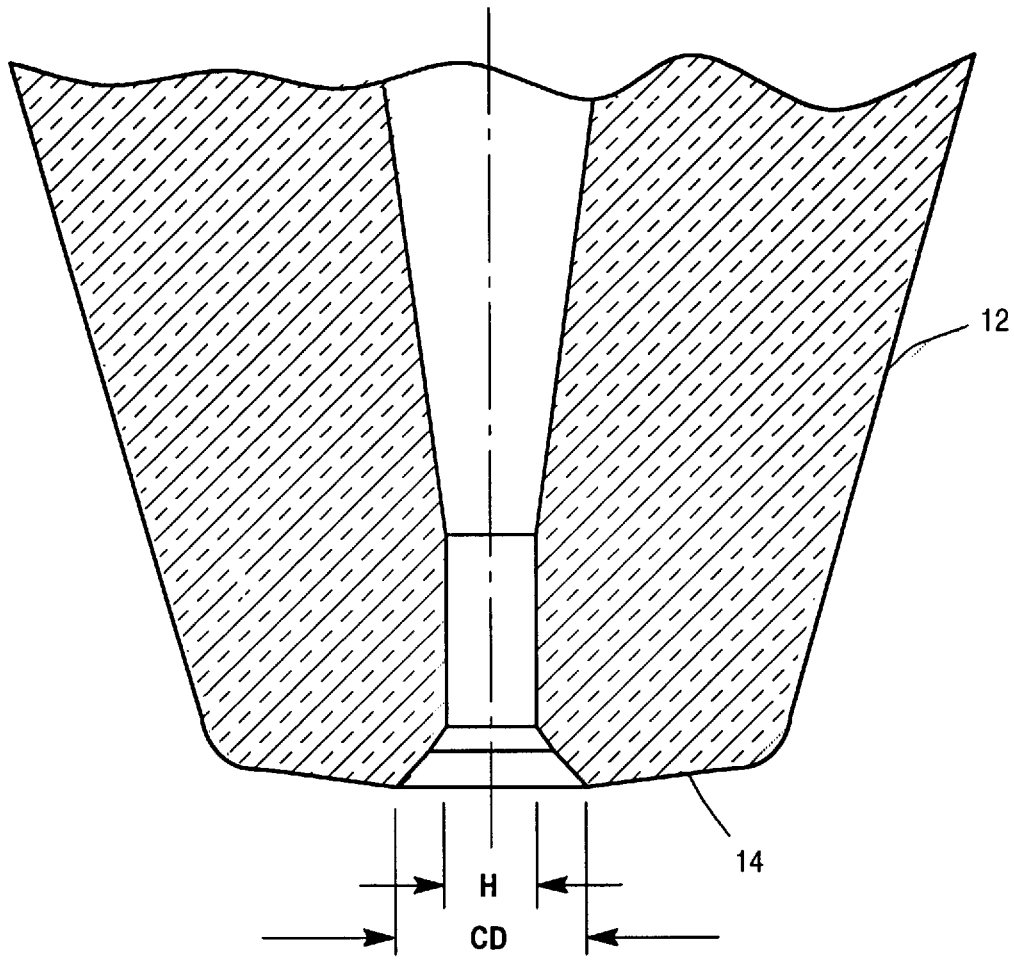
FIG. 4 is a greatly enlarged elevation in section of the FIG. 3 working tip showing a mashed ball bond whose bonded diameter exceeds the chamfer diameter.

Refer now to FIG. 4 showing an enlarged section in elevation of a prior art capillary bonding tool 12 having a preferred double chamfer shape used to make state of the art bonded balls 15 having a mashed diameter MD that only slightly exceeds the chamfer diameter CD and the air ball diameter.

A first problem with ball bond 15 as it now exists in the prior art is that there is no known way to consistently control the size of air balls which affects the mashed diameter MD. A second problem arises from the uncontrollability of the air ball size. When the ball is mashed with a predetermined force, the amount of lateral extrusion which occurs outside of the chamfer diameter (CD) cannot be controlled resulting in a bonded area that cannot be reliably predicted. It is generally assumed that the size of an air ball can be controlled by controlling the length of the wire tail and the amount and time of the current used to make a ball, however, decades of experience have proven this assumption to be erroneous to the detriment of manufacturers throughout the world. The present invention concept admits that the size of air balls cannot be controlled accurately enough to perform fine pitch bonds on the next generation of miniature semiconductor pads and start with the concept of reshaping air balls of varying size during the bonding operation to produce uniform reshaped bonded balls of uniform bonded diameter. It was completely unexpected that the reshaped bonds would have an enhanced unit shear strength. Examination of data leads the inventors to believe that the shape of the recessed chamber which has greater surface contact with the air ball than prior art tool tips provide better ultrasonic coupling of energy from the tool to the air ball to the pad with a more uniform downward force, thus, creating a better bond. Data collected in mass production runs may alter the reasons, but the synergistic results are already confirmed. Unit shear bonding strength may be increased by 10 to 20 percent while performing the principal purpose of the invention.

Figure 5:
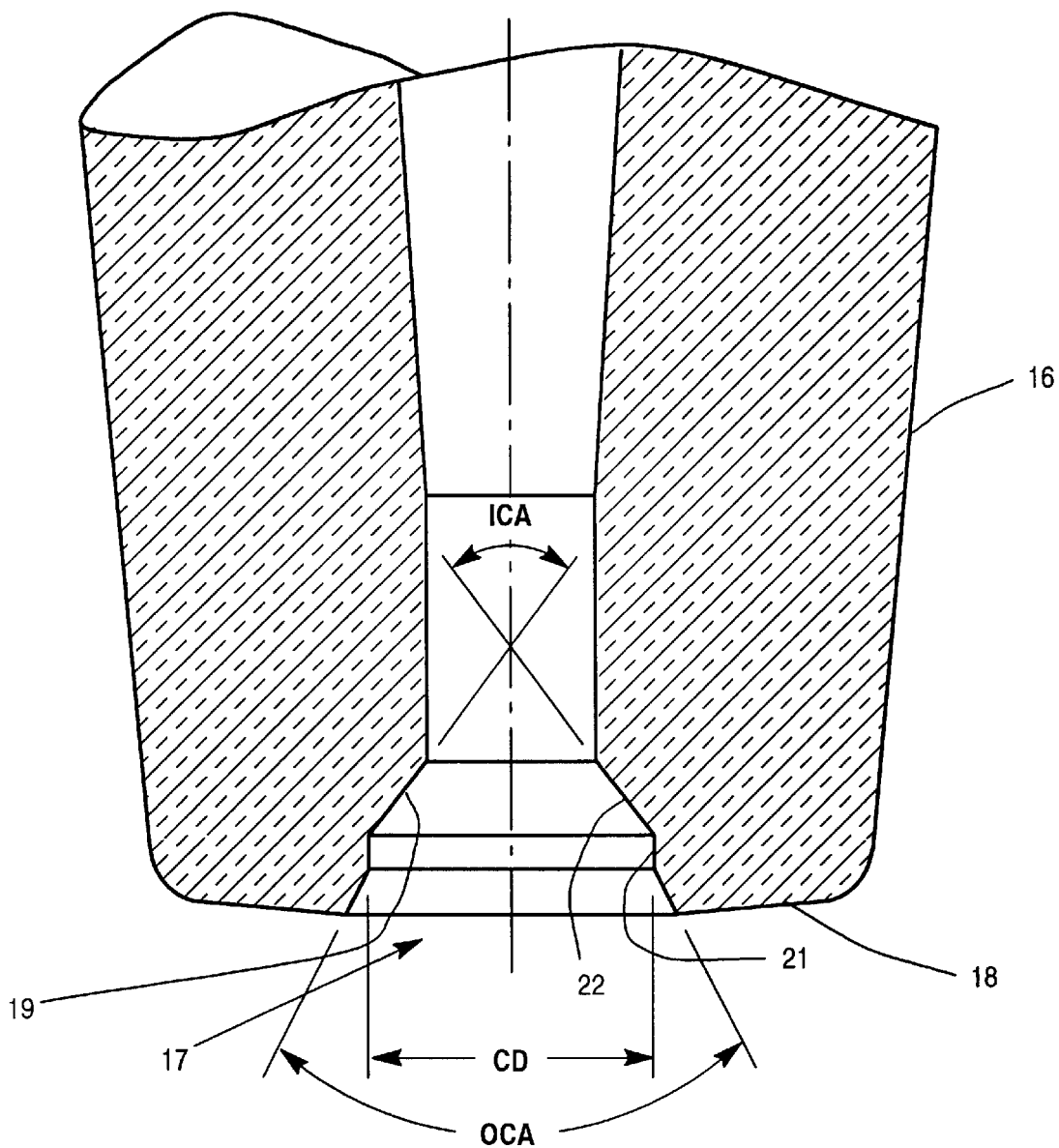
FIG. 5 is an enlarged section in elevation of a working tip showing a preferred embodiment ball constraining recess of the type which constrains lateral ball expansion.

Refer now to FIG. 5 showing an enlarged section in elevation of a working tip 16 having a ball constraining recess 17 in the working face 18. This preferred embodiment illustrates three stepped portions. The outer annular cone 19 is provided with an outer cone angle (OCA) of about 40 degrees, that may vary between 5 and 90 degrees and still perform its dual function of guiding the air ball into the recess and restraining lateral extrusion.

The ball constraining portion 21 is substantially cylindrical in shape and is smaller in diameter than the air ball to be bonded. While this portion is shown relatively shallow in this embodiment it may be combined with the portion 19 and then only slightly tapered up to about 15 degrees to receive an air ball. When the first two steps are combined, the upper annular portion 22 shown as a truncated cone having an inner cone angle (ICA) of about 40 to 60 degrees is preferably increased up to about 180 degrees. This upper annular cone or shoulder 22 serves the principal purpose of exerting a downward bonding force on the air ball while simultaneously shaping the bonded ball in the constraining recess. This shoulder may be formed by a curved radius or a truncated cone which has some advantage in simplifying manufacture. The shape can be curved or linear and still be tapered and perform the intended mode of operation.

Figure 6:
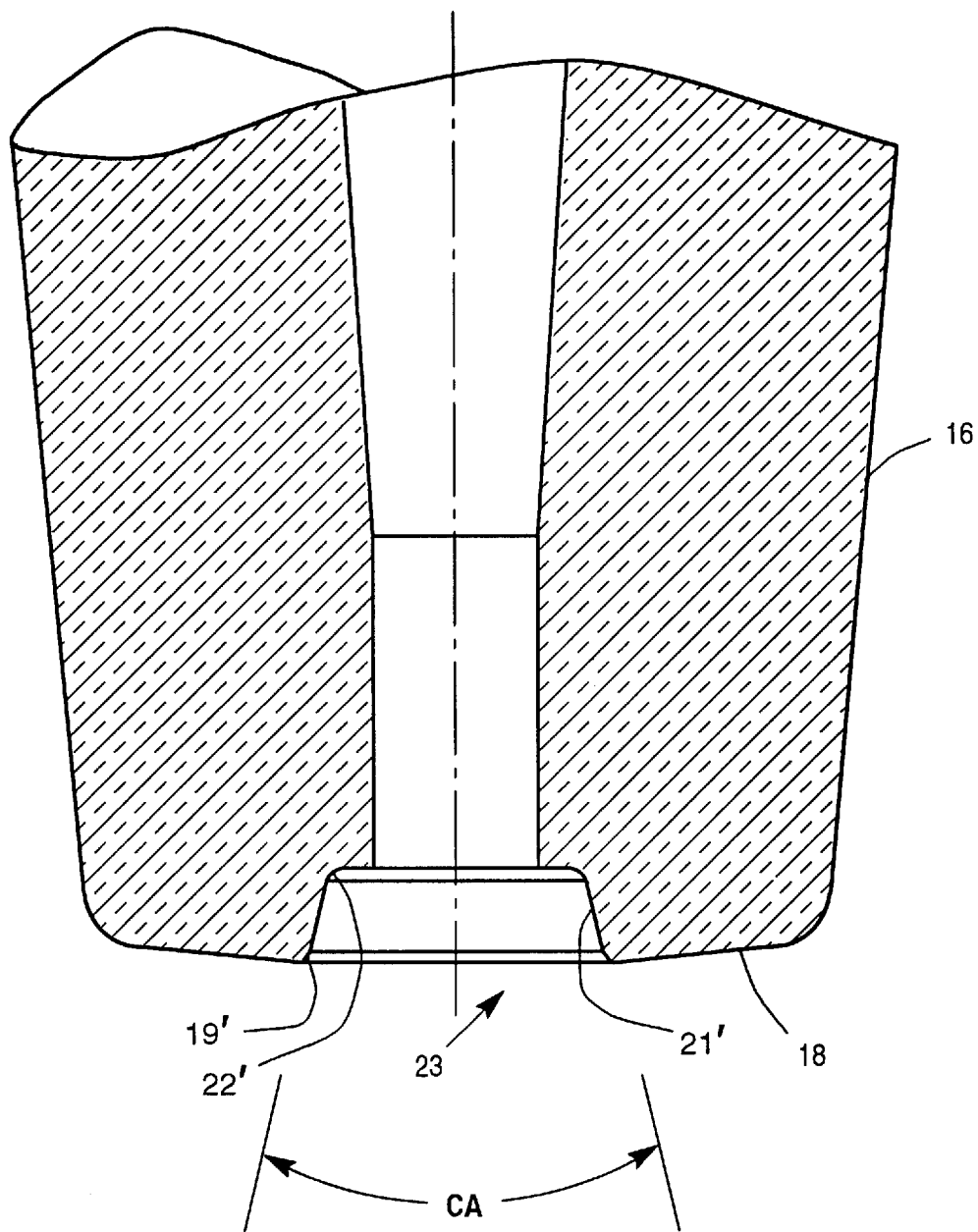
FIG. 6 is an enlarged section in elevation of another preferred embodiment showing a different ball constraining recess of the type which constrains lateral ball expansion.

Refer now to FIG. 6 showing an enlarged section in elevation of a working tip 16 having a ball constraining recess 23 in the working face 18. This modified embodiment shows the ball constraining portion 21' to be a truncated cone shaped recess which both guides and shapes the air ball. The outer annular recess portion 19' is very shallow and may be cone shaped or formed as an outer radius. The inner annular recess portion 22' is also very shallow and also may be formed as a cone shape or as an inner radius.

Figure 7:
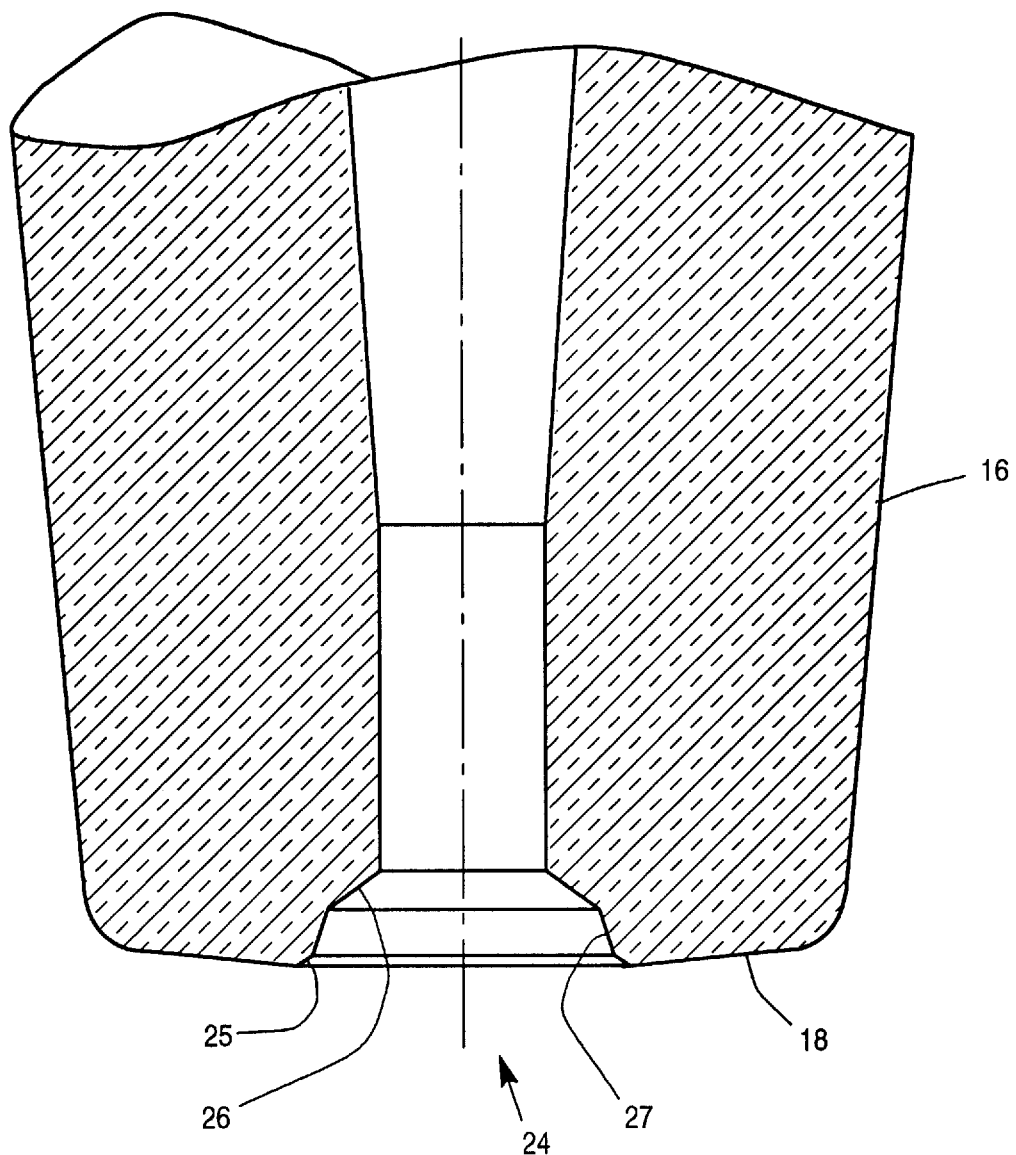
FIG. 7 is an enlarged section in elevation of yet another preferred embodiment showing a different ball constraining recess of the type which constrains lateral ball expansion.

Refer now to FIG. 7 showing an enlarged section in elevation of a working tip 16 having a ball constraining recess 24 in the working face 18. This modified embodiment shows two distinct steps in the recess 24. The cylindrical constraining portion 27 and the inner annular portion 26 are formed as truncated cones having cone angles designed to best accomplish their intended functions of guiding an air ball into the recess and generating a downward force on the ball during bonding respectively. The slightly tapered cylindrical portion 27 still forms the function of restraining lateral expansion of the air ball during bonding. The outer annular portion 25 may be a cone or a radius.

Having explained three preferred embodiment bonding tools and the functions performed by the different portions of the recesses 17, 23 and 24 it should be understood that further modifications are possible using the step portions from one or more tools and still be able to make symmetrical shaped bonds that are not laterally extruded. Further, the bonded balls have uniform bond size even though the air ball size may vary. Higher unit shear strength than prior art bonds is achieved.

Figure 8:
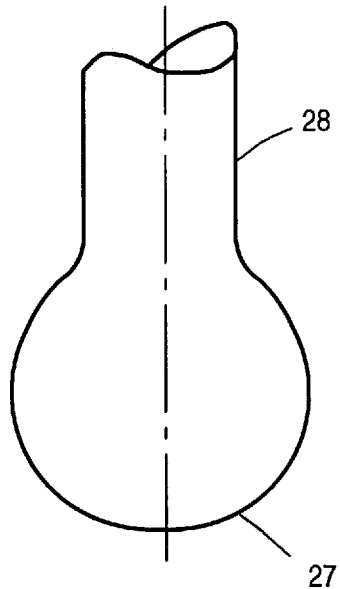
FIG. 8 is an enlarged side, or elevation view, of an air ball smaller than the chamfer diameter and larger in diameter than the constraining chamber used with the present invention bonding tools.

Refer now to FIG. 8 showing an enlarged side or elevation view of an air ball 27 made by melting a portion of a wire tail 28 while extending from a capillary bonding tool. The ball 27 made on the tail 28 is preferably made by a high voltage electronic spark referred to as electronic flame off or (EFO) which has replaced use of a hydrogen flame used heretofore.

It is known that the size of an air ball may be controlled by (1) controlling the length of the wire tail which extends from the capillary after making a second wire bond and breaking the wire, (2) controlling the current in the EFO gap, and (3) controlling the time the EPO current presist. Even though these parameters are carefully controlled, it has not been possible to produce the same size air ball consistently. In order to overcome this problem and achieve a high bond strength at least two alternative methods are presently employed.

The first alternative can be called bigger is better. If the air ball is made with a large ball size ratio (BSR) and bonded with a tool having a chamfer diameter as big as the ball, then laterally extruded during the bonding operation, the unit shear strength of the bond can be made smaller than 5.0 grams/square mil because the area bonded is so large it exceeds the tensil strength of the wire at first bond. The problem that exists is that these bonds cannot be made on small pitch bonding pads.

The state of the art at the time this invention was discovered for making fine pitch bonds was to make the BSR of the air ball less than 2.0 then laterally extrude the ball during a bonding operation to a predetermined size of about 2.0 mils. Tests were performed using a chamfer diameter of 1.9 mils and 1.6 mils, respectively. The air ball of less than 2.0 mils was bonded and extruded to a bonded diameter of 2.0 mil. The shear strength was measured and found to be 5.0 grams/mil$^2$ and 6.25 grams/mil$^2$ which illustrates that the smaller chamfer diameter tool, which extrudes more metal under the working face of the bonding tip produces higher unit shear strength. These experiments have shown that an annular ring of more than two tenths of one mil extruded outside of the selected chamfer diameter produces higher shear strength than bond made with less extrusion.

In contrast to the prior art teachings, applicants have discovered that they can make controlled diameter ball bonds with shear strength greater than 6.0 grams/mil$^2$ and control the mashed ball diameter to the size of the chamfer diameter without lateral extrusion.

Figure 9:
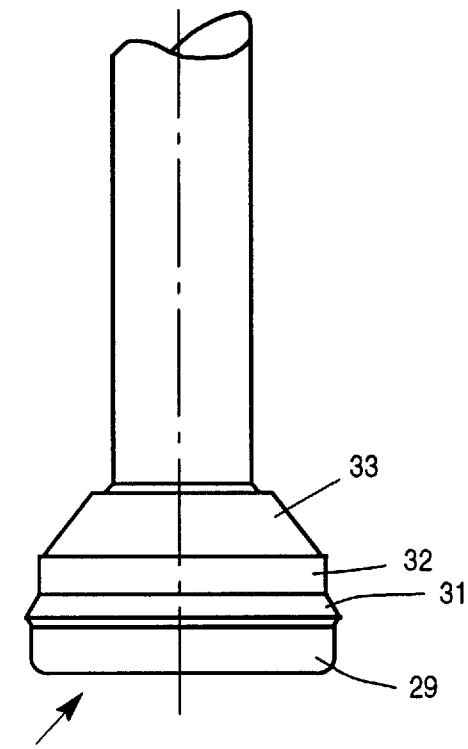
FIGS. 9 to 11 are side elevation views of three different shaped first bonds made with the present invention bonding tools showing that lateral expansion or mash out is controlled by extruding the air ball into the constraining chamber.

Refer now to FIG. 9 showing in side elevation the shape of a first bond produced with the bonding tool shown in FIG. 5. The air ball shown in FIG. 8 was made with a BSR between 1.6 and 1.7. The bottom portion 29 of the mashed ball 30 is mashed flat over an area less than the diameter of the air ball 27. A portion 31 of the lower half of air ball expands and forms into the outer annular cone 19 of recess 17. The constrained portion 32 of the ball 27 contains the middle of the air ball 27. The top portion 33 of the mashed ball contains the upper part of the air ball 27 and shows that the mashed air ball was formed by the upper annular portion of recess 17 and applies a downward force inside of the chamfer diameter. Since the largest diameter of the mashed air ball does not fill the outer cone 19 it never exceeds the chamfer diameter. By allowing the ball 27 to vertically extrude into the recess 17, the mashed ball diameter is easily controlled not to exceed the chamfer diameter. The skirt 31 forms into annular recess 17 and also applies a downward bonding force, thus limiting further lateral extrusion as well as downward movement of the bonding tool.

Figure 10:
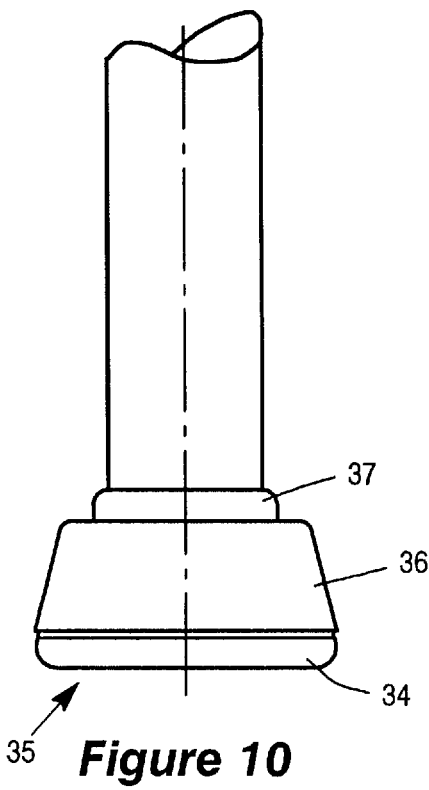

Refer now to FIG. 10 showing in side elevation the shape of a first bond produced with a bonding tool of the type shown in FIG. 6. In this embodiment the recess 23 is filled with the formed air ball 27 leaving only a bottom portion 34 of the mashed ball 35 outside of the recess 23. The cylindrical portion 36 is designed to fill the recess 35, however, for the larger variable size balls an extruded ring 37 becomes noticeable unless the hole diameter is reduced. The thickness of portion 34 easily accommodates the variations that always occur in air ball sizes.

Figure 11:
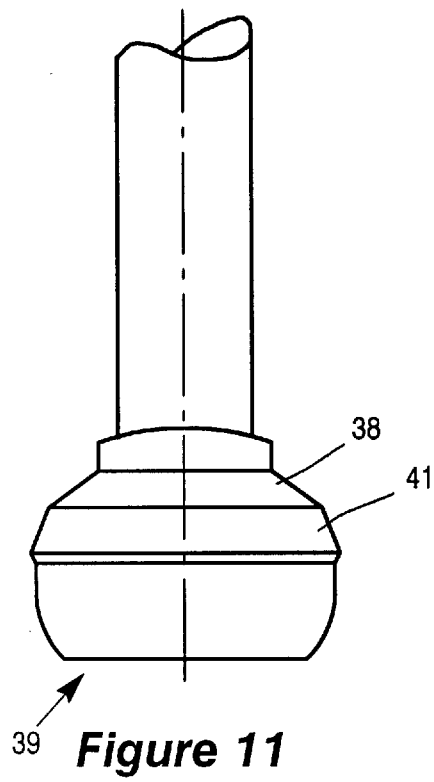

Refer now to FIG. 11 showing in side elevation the shape of a first bond produced with a bonding tool of the type shown in FIG. 7. In this embodiment the recess 24 captures about half of the air ball 27. The upper annular portion 38 of the mashed ball 39 has a larger inner cone angle (ICA) than the FIG. 5 embodiment and a smaller ICA than the FIG. 6 embodiment. The outer annular recess 25 serves as a guide or radius and is not intended to shape or form the mashed ball 39. The cylindrical portion 41 has a cone angle (CA) which is similar to the FIG. 6 embodiment and is intended to form the top of the mashed ball 39 and exert a downward bonding force thereon during a bonding operation.

It will be understood that variations of the tools shown in FIGS. 5 to 7 can be made and still maintain the forming and extruding step on an air ball in a constraining recess.

When the proper bonding parameters are selected to create mashed bonded balls having the same or smaller bonded diameters it will be found that the unit shear stress is increased. It is apparent from an examination of the preferred mashed ball bond shapes shown in FIGS. 9 to 11 that the bonds shown could be made undermashed or overmashed using improper bonding parameters and the preferred embodiment tool(s). However, over mashing defeats the fine pitch small area bond with little increase in total shear strength and smaller undermashed bonds leave a smaller footprint with a decrease in total shear strength without an increase in the diameter of the mashed bond.

We claim:

1. A fine pitch capillary bonding tool for making a consistent size fine pitch wire bond from air balls that vary in diameter, comprising:

a cylindrical shaped body having a wire hole through the body, larger than the wire to be bonded, a working tip on one end of the body, a working face on said working tip, a ball constraining recess in said working face, said ball constraining recess comprising a substantially cylindrical recessed portion with a diameter larger than the wire hole and smaller in diameter than the air ball to be bonded, said ball constraining recess further comprising a first ball guide shoulder at the entrance to said recess, and a ball force bonding shoulder at the upper portion of said recess for exerting a downward bonding force on an air ball formed into said ball constraining recess.

2. A bonding tool as set forth in claim 1 wherein said ball guide shoulder comprises a radius connected to a truncated cone shaped recessed portion.

3. A bonding tool as set forth in claim 1 wherein said ball force bonding shoulder comprises a radius connected to a truncated cone shaped recessed portion.

4. A bonding tool as set forth in claim 1 wherein said shoulders of said ball constraining recess each comprise an annular tapered ring.

5. A bonding tool as set forth in claim 1 wherein at least one of said shoulders of said ball constraining recess comprises a truncated cone.

6. A bonding tool as set forth in claim 1 wherein said ball constraining recess and said shoulder connected thereto form a stepped recess which converges from the chamfer diameter to the wire hole.

7. A bonding tool as set forth in claim 6 wherein said ball constraining recess comprises a plurality of steps greater than two.

8. A bonding tool as set forth in claim 7 wherein said steps comprise a plurality of truncated cones.

9. A bonding tool as set forth in claim 7 wherein said steps comprises at least one tapered radius.

10. A bonding tool as set forth in claim 1 wherein the entrance to said ball constraining recess is defined by a chamfer diameter opening which is greater than the diameter of an air ball to be bonded and the smashed ball diameter after bonding is equal to or less than said chamfer diameter.

11. A bonding tool as set forth in claim 10 wherein the entrance to said ball constraining recess comprises a truncated cone having a cone angle less than 90 degrees.

12. A bonding tool as set forth in claim 1 wherein said substantially cylindrical recessed portion comprises a truncated cone having a cone angle less than 15 degrees.

13. A bonding tool as set forth in claim 1 wherein said first ball guide shoulder comprises an annular cone shape having a cone angle less than 45 degrees.

14. A bonding tool as set forth in claim 1 wherein said ball force bonding shoulder comprises an annular cone shape having a cone angle greater than approximately 90 degrees.

15. A method for making uniform fine pitch wire bonds from air balls that vary in diameter, comprising the steps of:

forming a ball constraining recess in the working face of a capillary bonding tool which has an opening larger than the diameter of said air ball and a recess chamber smaller than the diameter of said air ball, bonding said air ball and simultaneously force forming said air ball into said recess chamber by vertical extrusion, and bonding said air ball and simultaneously laterally extruding the surface of said air ball being bonded to a diameter which does not exceed the diameter of said air ball.

16. The method as set forth in claim 15 which further includes the step of bonding said air ball with a predetermined downward force which determines the squashed diameter of said air ball.

17. The method as set forth in claim 15 wherein the step of force forming said air ball in said recess comprises the step of reducing the diameter of the portion of said air ball being extruded into said recess chamber.

18. The method as set forth in claim 15 which further includes the step of forming different size wire holes in different capillary bonding tools to bond air balls of the same diameter made on wires of different diameter.

* * * * *